United States Patent [19]

Daly et al.

[11] 4,422,972
[45] Dec. 27, 1983

[54] NOVEL LIGHT-SENSITIVE COMPOUNDS AND PHOTOREACTABLE COMPOSITIONS COMPRISING SAME

[75] Inventors: Robert C. Daly, Rochester; Danny R. Thompson, Fairport; Samir Y. Farid, Rochester, all of N.Y.

[73] Assignee: Eastman Kodak Company, Rochester, N.Y.

[21] Appl. No.: 260,434

[22] Filed: May 4, 1981

Related U.S. Application Data

[62] Division of Ser. No. 180,211, Aug. 21, 1980, Pat. No. 4,302,527.

[51] Int. Cl.³ ............................................. C07C 49/72
[52] U.S. Cl. .................................. 260/368; 260/367; 260/396 R
[58] Field of Search ........... 260/368, 367, 351, 396 R; 560/7, 51, 53; 546/88, 101

[56] References Cited

U.S. PATENT DOCUMENTS

| | | | |
|---|---|---|---|
| 1,749,501 | 3/1980 | Neresheimer et al. | 260/368 |
| 2,623,884 | 12/1952 | Peter et al. | 260/368 |
| 2,875,047 | 2/1959 | Oster . | |
| 3,060,024 | 10/1962 | Metuchen et al. . | |
| 3,628,962 | 12/1971 | Murray et al. . | |
| 3,832,171 | 8/1974 | Janssens | 546/101 |
| 4,012,302 | 3/1977 | Wang et al. . | |
| 4,035,189 | 7/1977 | Hayashi et al. . | |
| 4,040,923 | 8/1977 | Pacifici et al. . | |
| 4,208,340 | 6/1980 | Lee | 260/396 R |
| 4,302,527 | 11/1981 | Daly et al. | 260/396 R |

FOREIGN PATENT DOCUMENTS

| | | | |
|---|---|---|---|
| 68802 | 3/1953 | United Kingdom | 546/88 |
| 1425233 | 2/1976 | United Kingdom . | |
| 1504616 | 3/1978 | United Kingdom . | |

OTHER PUBLICATIONS

Schonberg et al., "Preparative Organic Photochemistry," (1968) Chapters 12, 18, 19 & 41d.
Chemical Abstracts, vol. 82, No. 163013p, Sep. 4, 1974,
Goto et al., "Multicopy Electrophotographic Systems", Japan Kokai: 74-93,018.
Kothe, Regarding the Photochemistry of the p-Quinone, 1969, a translated excerpt of pp. 10–11, doctoral dissertation from Friedrich–Wilhelms University, Bonn.
Kosar, "Light-Sensitive Systems" (1965) p. 332.
Bruce, *Quart. Rev.*, vol. 21, p. 405 (1967).
Rubin, "Photochemistry of O-quinones & —Diketones," *Fort Schritte der Chem. Forschung*, vol. 13, p. 251 et seq. (1969).

*Primary Examiner*—Delbert E. Gantz
*Assistant Examiner*—Raymond Covington
*Attorney, Agent, or Firm*—Dana M. Schmidt

[57] ABSTRACT

There are disclosed light-sensitive compounds and a composition comprising (a) such compounds and (b) a compound having at least one reactive site capable of stepwise photoreaction with the light-sensitive compounds. The light-sensitive compounds have the structural formula,

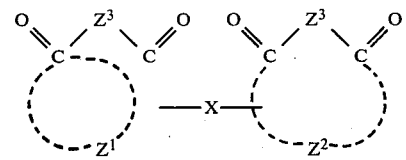

wherein
$Z^1$ and $Z^2$ are each independently the number of non-metallic atoms necessary to complete 1, 2, 3, or 4 unsaturated carbocyclic or heterocyclic rings of from 6 to 18 nuclear atoms;
$Z^3$ is either a carbon-to-carbon bond or vinylene;
and X is a linking group.

The composition can be applied to a variety of supports and photoreacted by exposure to activating radiation.

9 Claims, No Drawings

NOVEL LIGHT-SENSITIVE COMPOUNDS AND PHOTOREACTABLE COMPOSITIONS COMPRISING SAME

This is a division of application Ser. No. 180,211, filed Aug. 21, 1980 now U.S. Pat. No. 4,302,527.

FIELD OF THE INVENTION

This invention relates to sensitizers, and photoreactable compositions containing (a) the sensitizers and (b) compounds that photoreact with the sensitizers.

BACKGROUND OF THE INVENTION

A variety of bis compounds are known to be useful as sensitizers for photopolymerization of ethylenically unsaturated compounds. Benzophenone, with or without substituents, is one that is widely used. Others include

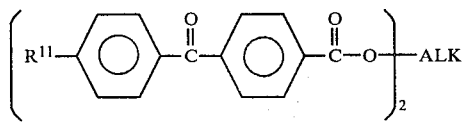

wherein $R^{11}$ is a halogenated alkyl, ALK is preferably a divalent alkyl, as shown, for example, in U.S. Pat. No. 4,040,923, issued on Aug. 9, 1977; bis(substituted diphenyl) alkyleneamines such as are disclosed in U.S. Pat. No. 4,035,189, issued on July 12, 1977; bis-aryl-dicarbothioic acid esters as disclosed, for example, in U.S. Pat. No. 4,012,302, issued on Mar. 15, 1977; azo-bis and hexa-aryl bis compounds such as are disclosed in British patent specification No. 1,504,616; and bis compounds containing non-adjacent keto groups such as are disclosed in U.S. Pat. No. 3,628,962, issued on Dec. 21, 1971.

However, each of the aforementioned is disclosed for use only with specific compounds, such as epoxy compounds or those having ethylenic unsaturation, or with polymers such as nylon which have had to be modified to include an appended sensitizable adjunct. Thus, polymers have been rendered photocrosslinkable, when used with a sensitizer, by adding to the polymer a specific crosslinkable pendant moiety, such as one containing ethylenic unsaturation. Without such expensive modification of non-light-sensitive compounds, such latter compounds are not useful in a photocrosslinkable system.

What has long been desired is a photoinitiator or sensitizer which will permit a large variety of compounds, including those not ordinarily light sensitive, to be photopolymerized or photocrosslinked. The result would be a greater variety of compositions useful in preparing an inexpensive litho printing plate, photoresist, or light-hardenable coating. No longer would it be necessary to rely, as in the past, on expensive, tailor-made photosensitive polymers.

Yet another difficulty common with some sensitizers is that the sensitizer transfers its photoactivated energy via a triplet-triplet energy exchange, leaving the sensitizer with its original chemical structure intact after the exchange. The continued absorption of the sensitizer at that portion of the composition makes it difficult for portions underneath to be exposed, e.g., as would occur for thicker layers. The result is an effective limitation on the thicknesses that can be coated and effectively exposed.

SUMMARY OF THE INVENTION

In accordance with the present invention there is advantageously featured a first, light-sensitive compound and a photoreactable composition comprising that light-sensitive compound and a second compound. Such second compound can be one that by itself is considered to be non-light sensitive.

In a related feature of the invention, the noted composition is effective to provide stepwise photocrosslinking or photopolymerization even though a prior art step has been eliminated, namely the expensive pre-treatment of the second compound to add a light-sensitive moiety.

An additional feature of the invention is that the first, light-sensitive compound is destroyed when it photoreacts with the second compound, thereby permitting relatively thick coatings to be exposed without loss of exposure due to the absorption that would occur if the reacted first compound had remained in its original form.

The aforesaid features of the invention result from a light-sensitive compound having a structural formula

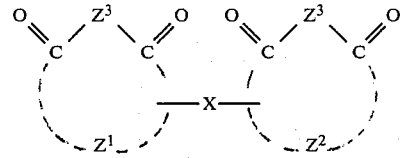

wherein $Z^1$ and $Z^2$ are each independently the number of nonmetallic atoms necessary to form 1, 2, 3, or 4 unsaturated carbocyclic or heterocyclic rings of from 6 to 18 nuclear atoms;

$Z^3$ is either a carbon-to-carbon bond or vinylene;

and X is a linking group.

When the light-sensitive compound of the invention is combined with certain other compounds, a stepwise photoreactable composition results. More specifically, such a composition comprises the aforesaid light-sensitive compound admixed with a compound containing at least one reactive site capable of stepwise photoreaction with the light-sensitive compound.

The composition can be applied to a support, and thereafter photoreacted by exposure to activating radiation.

Other features of the invention will become apparent upon reference to the following Description of the Preferred Embodiments.

DESCRIPTION OF THE PREFERRED EMBODIMENTS

The invention is based upon the discovery that certain novel light-sensitive compounds will, when photoactivated, stepwise photoreact with a wide variety of other compounds, hereinafter the "reactive site-containing" compound of the composition.

As used herein, "compound," unless further modified, includes both polymers and simple compounds, here used to mean non-polymerized compounds. Therefore, by means of this invention, compounds that are stepwise photoreacted include simple compounds or polymers. "Photoreaction" and related words mean, in response to exposure to activating radiation, a crosslinking if the second compound is a polymer, and a stepwise photopolymerization if the second compound is a simple compound. "Stepwise photopolymerization" refers to the reaction wherein each photon results in one addition reaction between two simple compounds, as distinguished from photoinitiated chain-addition polymerization.

"Aromatic", "heterocyclic" and "vinylene" as used herein include both substituted and unsubstituted aromatic, heterocyclic and vinylene, respectively, unless stated otherwise. Typical examples of substituents for such substituted moieties include one or more of the following: halogen such as chlorine and iodine; alkyl or alkoxy such as methyl, ethyl, propyl, isopropyl, methoxy, ethoxy and propoxy; aryl or aryloxy such as phenyl and phenoxy; carboxyl; cyano; fluorinated alkyl such as di- and trifluoromethyl; sulfonic acid salts; and acyl such as acetyl and benzoyl.

In the case of a photocrosslinking reaction, the polymers constitute the major portion, by total weight, of the crosslinked product, and the sensitizer constitutes the minor portion. "Major" and "minor" refer respectively to more than and less than 50 weight percent of the total composition.

The light-sensitive compounds of the invention, hereinafter "sensitizers," preferably are selected to have a spectral response at 550 nm or below, and are simple (as opposed to polymeric) bis-quinones of the structure recited in the Summary. Each of the rings completed by the groups $Z^1$, $Z^2$ and $Z^3$ is heterocyclic or carbocyclic to form, e.g., benzoquinone, 1,2- or 1,4-naphthoquinone, anthroquinone, phenanthroquinone, or thiophenanthroquinone. The selection of the atoms for $Z^1$, $Z^2$ and $Z^3$ follows the principle that the two moieties joined together by the linking group X form a compound that will photo-combine at the ortho- or para-dicarbonyl functions with the reactive site of the second compound of choice, hereinafter described.

Any linking group X is useful, as long as it does not impair or quench the photoreactions. Highly preferred examples of linking group X include the following:

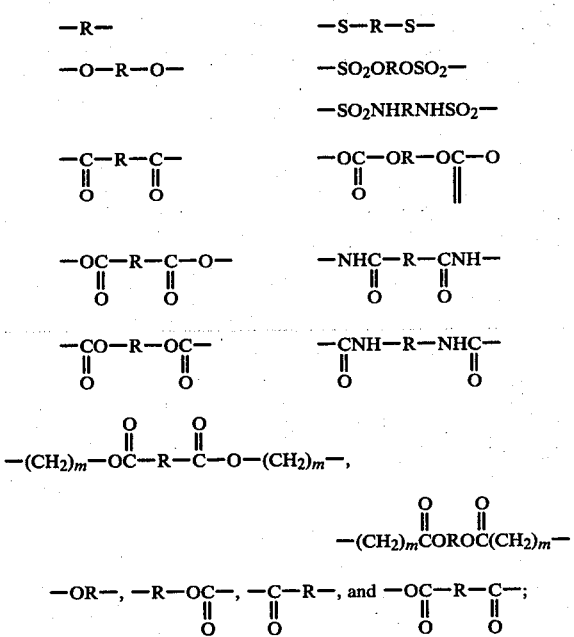

wherein

R is alkylene of 1–8 carbon atoms, arylene of 6 to 10 carbon atoms, arylenealkylene of from 7 to 18 carbon atoms, arylenebisalkylene of from 8 to 20 carbon atoms, or a water-solubilizing group such as a group containing a sulfonic acid salt or a quaternized ammonium salt. R of the linking X group includes straight chain or branched chain alkylene, e.g., methylene, ethylene, and 2,2-dimethyl-1,3-propylene. Examples of arylene include phenylene and naphthalene. Examples of arylenealkylene include phenylenemethylene, and examples of arylenebisalkylene include phenylenedimethylene.

Specific examples of sensitizers of the invention include bis-phenanthroquinones, bis-naphthoquinones and compounds wherein $Z^1$ and $Z^2$ form a 6-carbon ring or fused carbocyclic or heterocyclic rings containing 6 to 18 carbon atoms, for example, sensitizers having the structures

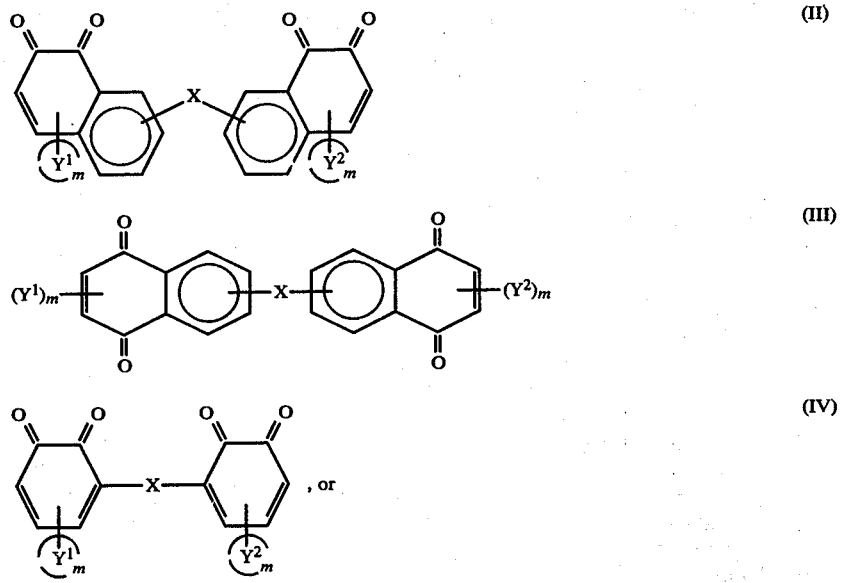

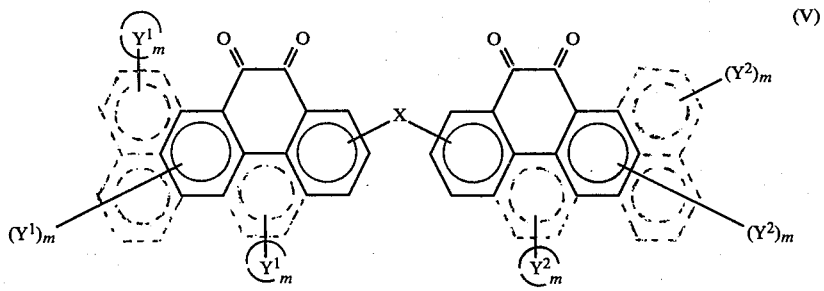

wherein only one dotted-line ring is present on each side of the linking X group, m is 1, 2 or 3, X is as described above, and $(Y^1)_m$ and $(Y^2)_m$ are each independently hydrogen or one (or more, for m greater than 1) of the substituents described above for substituted carbocyclic and heterocyclic groups. Examples of structural formula (V) include bis(4,5-pyrenediones), bis(5,6-chrysenediones) and bis(benz[a]anthracene-5,6-diones).

Specific examples of bis-heterocyclic compounds are those wherein $Z^1$ and $Z^2$ form, e.g., benzo(h)quinoline-5,6-dione or 1,10-phenanthroline-5,6-dione.

Not all of compounds (II) through (V) can be expected to work equally well. Compounds of structure (III), for example, are synthesizable only in very low yields, and can be expected to act as sensitizers for a fewer number of the reactive site-containing compounds of the composition.

Of the sensitizers previously described, the following are particularly advantageous and preferred by reason of their enhanced solubility and/or solubility in a wider class of solvents: bis[2-(9,10-phenanthroquinone-3-yl)ethyl] succinate; bis[2-(9,10-phenanthroquinone-3-yl)ethyl] 3-methylglutarate; bis[2-(9,10-phenanthroquinone-3-yl)ethyl] 2-ethyl-2-methylsuccinate; 2-(9,10-phenanthroquinone-3-yl)-ethyl 9,10-phenanthroquinone-3-carboxylate; and 2-ethyl-2-methyl-1,3-propylene bis[9,10-phenanthroquinone-2(3)-carboxylate], prepared from a mixture of 2- and 3-phenanthroyl chloride. For example, these compounds are soluble in one or more of 1,2-dichloroethane, methylene dichloride, methyl ethyl ketone, cyclohexanone, and pyridine.

The reactive site-containing compound of the composition, that is, the compound that reacts with the sensitizer, has at least one reactive site. If the compound is a simple compound, it has two such sites. Useful reactive sites capable of stepwise photoreaction with the sensitizers of the invention include an aldehyde; an abstractable hydrogen atom attached to a carbon that is alpha to an ether, ester, thioether, thioester, aromatic ring, alkyne or an olefin; and one or more unsaturated moieties having the structure

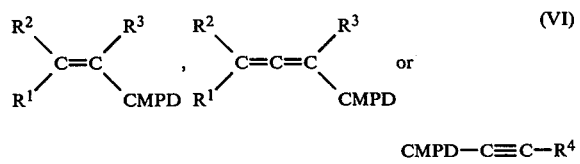

$$CMPD-C\equiv C-R^4$$

wherein $R^1$, $R^2$, and $R^3$ are each individually a carbon-to-carbon bond; hydrogen; halogen such as chlorine and bromine; alkyl of from 1 to about 5 carbon atoms, for example, methyl, ethyl and propyl; aryl of from 6 to 10 carbon atoms, e.g., phenyl, naphthyl; alkoxy, thioalkoxy or aryloxy of from 1 to 6 carbon atoms, for example, methoxy, thiomethoxy, ethoxy and phenoxy; or acyl or ester of from 1 to 7 carbon atoms, e.g., acetyl, benzoyl, and $CH_3(CH_2)_nOCO-$ where n is 1 to 5; or together $R^1$ and $R^2$ or $R^2$ and $R^3$ comprise the number of nonmetallic atoms necessary to complete a carbocyclic or heterocyclic, mono- or bicyclic ring containing from 4 to 9 ring atoms; $R^4$ is hydrogen, alkyl of 1 to 6 carbon atoms, e.g., methyl, ethyl, butyl, and the like, or aryl of 6 to 10 carbon atoms, such as phenyl and naphthyl; and CMPD is the remainder of said reactive site-containing compound.

The unsaturated moieties noted above as reactive sites tend to be at least moderately electron-donating, and therefore have the necessary reactivity in the presence of the light-activated sensitizer. As used herein, an "abstractable" hydrogen atom is one that is capable of being abstracted by the light-activated sensitizer.

If the reactive site is an unsaturated moiety of structure (VI), $R^1$ and $R^2$ or $R^2$ and $R^3$ can together comprise the atoms necessary to complete a carbocyclic or heterocyclic ring of 4 to 7 ring atoms, e.g., cyclohexene.

Thus, useful compounds having the defined reactive sites include simple compounds containing the reaction sites and homopolymers and copolymers derived from monomers containing one or more of the reactive sites. Highly useful examples include vinyl addition polymers such as polyacrylates, and celluloses.

The following Tables I and II indicate representative examples of useful compounds containing such reactive sites. The code letters under "type of site" mean: A—olefinic or alkyne group, B—aldehyde, and C through I—abstractable hydrogen atoms alpha to:

C—an ether
D—an ester
E—a thioether
F—a thioester
G—an aromatic ring
H—an olefinic group
I—an alkyne.

TABLE I

| Compound | Type of Site* |
|---|---|
| poly(methyl methacrylate) | D |
| poly(benzyl methacrylate) | D & G |
| poly(4-methoxybenzyl methacrylate) | D, C and G |
| poly(3,4-dimethoxybenzyl methacrylate) | D, C and G |
| poly(benzyl methacrylate-co-methyl-methacrylate) | D & G |
| poly(hydroxyethyl methacrylate-co-methyl methacrylate) | D |
| polystyrene | G |
| poly(4-vinyltoluene) | G |

TABLE I-continued

| Compound | Type of Site* |
|---|---|
| poly(4-methoxystyrene) | C & G |
| poly(vinyl benzoate) | D |
| poly(vinyl 4-methoxybenzoate) | D & C |
| poly(vinyl 3,5-dimethoxybenzoate) | D & C |
| poly(vinyl 4-methylbenzoate) | D & G |
| poly(vinyl 4-methylthiobenzoate) | D & E |
| poly(ethylene succinate) | D |
| poly(4,4'-isopropylidenebis(3,5-dimethylphenylene) terephthalate) | G |
| poly(4,4'-isopropylidenebis(3-methylphenylene) terephthalate) | G |
| ethyl cellulose | C & D |
| poly(vinyl 4-isopropoxycarbonylbenzoate) | D |
| poly[4-(2-formylphenoxymethyl)styrene | G, B, and C |
| cellulose acetate | C & D |
| poly(allyl methacrylate) | A & H |
| poly(propargyl methacrylate) | A & I |

*In the case of more than 1 type of reactive site, the order given is not intended to represent the order of the most active sites.

All of the above polymers are normally considered to be non-light sensitive when exposed to conventional light sources. Furthermore, they are not crosslinkable with conventional sensitizers. Accordingly, prior to this invention it has been difficult, if not impossible, to crosslink these polymers, with or without a sensitizer, by exposure to light radiation.

TABLE II

| Compound | Type of Site |
|---|---|
| cyclized polyisoprene having the recurring units: | A |

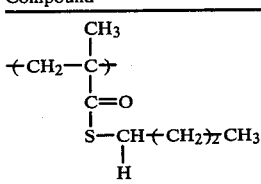

| | |
|---|---|
| a polymer having the recurring units | A, D, and H |

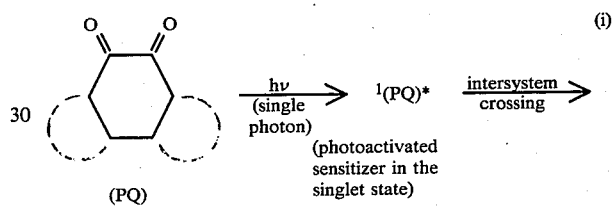

| polymer having recurring units with the structure | F |

TABLE II-continued

| Compound | Type of Site |
|---|---|

As noted above, a number of the polymers have more than one type of reactive site in a given recurring unit, e.g., more than one type of abstractable hydrogen atom. Although it is not important to the practice of the invention, it is believed that in such a case one type of site may be more reactive than the other(s).

Although an understanding of the mechanism of the invention is not necessary to the practice of the invention, and it is not fully understood, such mechanism is believed to be the following: Considering first only one quinone portion of a bis-quinone sensitizer, the reaction is believed to be

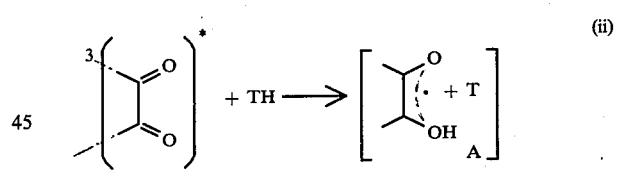 (i)

(ii)

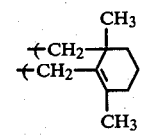

where H = abstractable hydrogen atom and T = the remainder of the compound (iii)

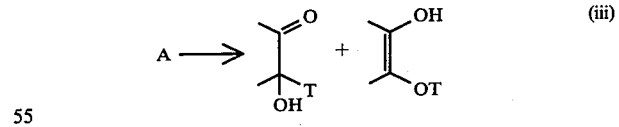

(As usually is the case in such reactions, other processes might compete, and these include the formation of hydroquinone and coupled products T-T.) Another photon can complete the reaction (iii) by causing the other quinone portion of the sensitizer to react with another site which is TH in the illustration.

Examples of simple, low-molecular weight compounds having the above-described reaction sites and that are stepwise polymerizable by the sensitizers of the invention include xylene and terephthalaldehyde.

In the event the reactive site is an unsaturated moiety of the type

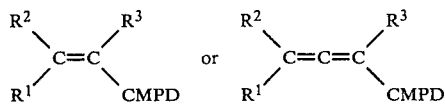

noted above, the reaction is believed to proceed, e.g.:

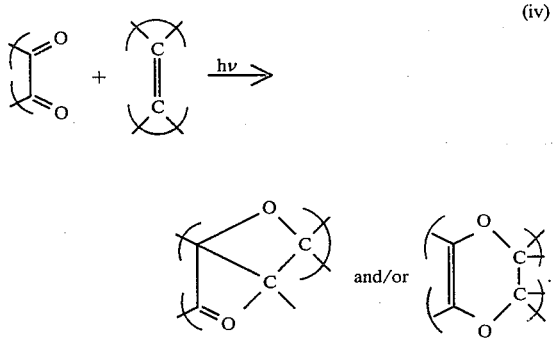

It will be appreciated that many of the listed reactive site-containing compounds that stepwise photoreact by the process of this invention are themselves non-lightsensitive and cannot be conveniently photoreacted using sensitizers of the prior art. Yet, they are far simpler and less expensive to use than the specially-tailored, lightsensitive polymers of the prior art. This invention then permits the use of the simpler polymers as the primary or major component of the photopolymerized product.

As is evident from reactions (i) through (iv) above, the crosslinking reaction destroys the chromophore of the sensitizer, so that minimal absorption losses occur in the exposed regions such as would interfere with the exposure of relatively thick coatings.

The composition of the invention is preferably coated from a suitable solvent onto a suitable support and dried. The composition in such a use comprises from about 0.05% to about 20 weight percent of the sensitizer based upon the weight of the compound that is to be photoreacted, and is preferably from about 1 to about 5 weight percent, depending on the coating thickness. For example, for a coating thickness of about 10 microns, a 3 weight percent amount of sensitizer appears to give maximum speeds.

The support for the composition can be a variety of known supports, including photographic supports. Typical useful supports include polymeric film, wood fiber—e.g., paper, metallic sheet and foil, glass, oxide-coated semiconductors and ceramic supporting elements. The support can be provided with one or more subbing layers to enhance the adhesive, antistatic, dimensional, abrasive, hardness, frictional, and/or other properties of the support surface which might be desired.

Useful polymeric film supports include films of cellulose nitrate and cellulose esters such as cellulose triacetate and diacetate, polystyrene, polyamides, homo- and copolymers of vinyl chloride, poly(vinyl acetal), polycarbonate, homo- and copolymers of olefins, such as polyethylene and polypropylene, and polyesters of dibasic aromatic carboxylic acids with divalent alcohols, such as poly(ethylene terephthalate).

Useful paper supports include those which are partially acetylated or coated with baryta and/or a polyolefin, particularly a polymer of an α-olefin containing 2 to 10 carbon atoms, such as polyethylene, polypropylene, copolymers of ethylene and propylene and the like.

Further details of useful supports can be found in Research Disclosure, Vol. 176, Publication No. 17643, Para. XVII (Dec. 1978), published by Industrial Opportunities Ltd., Homewell, Havant, Hampshire, P09 1EF, United Kingdom the content of which is expressly incorporated herein by reference.

The composition of the invention can be applied to the support for a variety of uses, by a variety of techniques such as spray-coating, whirler-coating, curtain-coating, and roll-coating, all of which are conventional.

The coating so prepared can have a variety of thicknesses, e.g., less than 1 micron to thicknesses in the millimeter range.

Highly preferred uses of the composition are as photoresists for the manufacture of circuit boards and microelectronic devices. Depending on which compound is selected to be photopolymerized by the sensitizer, the photoresists can withstand, after exposure, hot $FeCl_3$ solutions as well as plasma or buffered HF etching. In such uses preferred developers of the unexposed portions of the coating include dichloroethane; cyclohexane; 1,1,1-trichloroethane; and trichloroethylene, for example.

Alternatively, the composition can be applied to any manner of support, substrate, or article of manufacture, and non-imagewise exposed on the support to cure it into a photohardened, uniform film.

As still another alternative, the composition can be used as a photoreactable adhesive that crosslinks with an adjacent layer having one of the second polymers described herein, as part of the composition of the adjacent layer.

PREPARATION OF THE SENSITIZERS

Certain sensitizers of this invention are prepared by the following general reaction scheme:

3-Phenanthroic acid is converted to the acid chloride and subsequently esterified with a diol to give a bisphenanthroate.

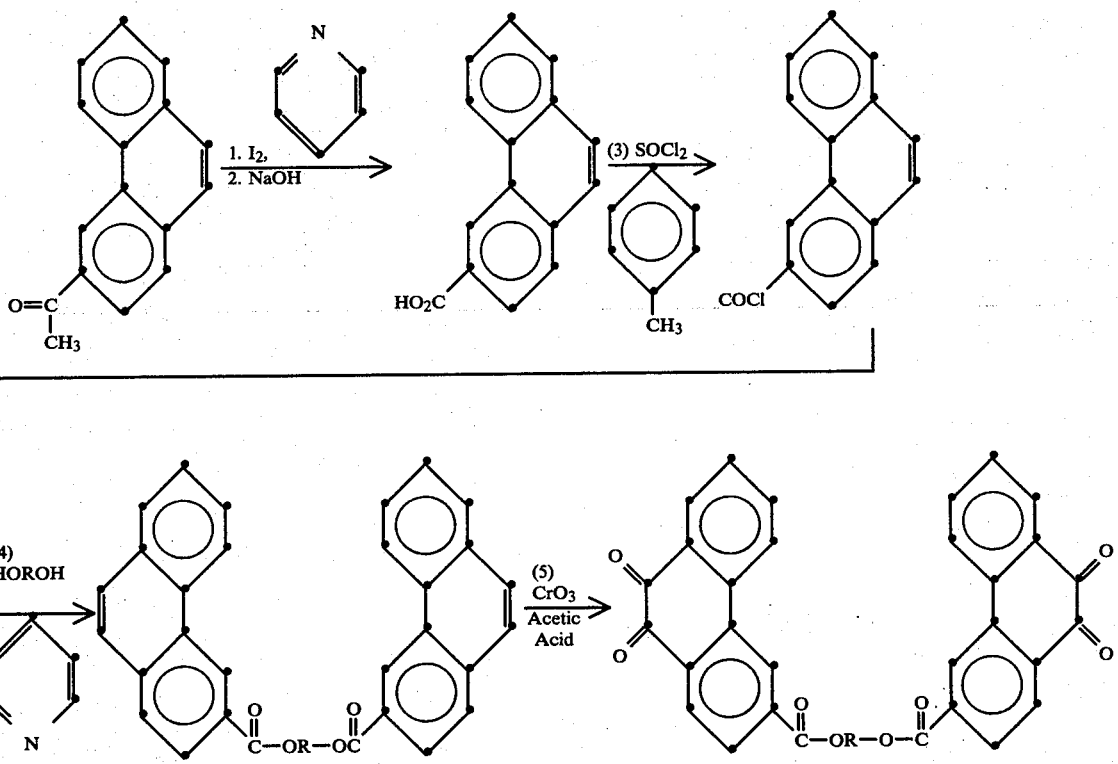

wherein R represents the moieties noted in the description of "X" above. Reactions (1), (2) and (3), as well as the starting material of reaction (1) are well known and require no further elaboration.

The following preparative examples are included to further illustrate the preparation of the sensitizers of this invention.

Preparation I

2-Ethyl-2-methyl-1,3-propylene di(3-phenanthroate)

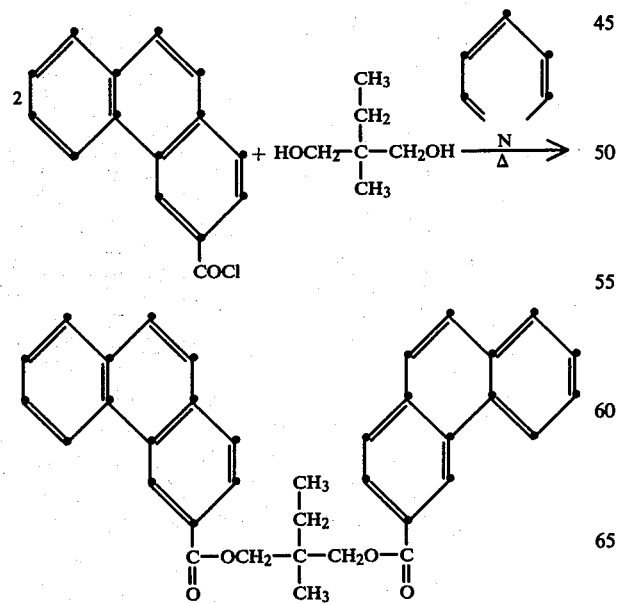

74.0 g (0.31 mole) 3-phenanthroyl chloride plus 16.6 g (0.14 mole) 2-ethyl-2-methyl-1,3-propanediol were added to 400 ml dry pyridine in a 1-liter Erlenmeyer flask equipped with a magnetic stirrer. The resulting dark-colored mixture was heated with stirring to about 100° C. and then allowed to cool to room temperature. The cool mixture was poured into 3 liters of well-stirred water acidified with HCl, whereupon the crude product separated immediately as a light yellow-white semi-solid. The product was filtered, washed with water and allowed to air dry. The crude product was taken into a minimum quantity of acetone and reprecipitated into well-stirred water, filtered, washed again with water and allowed to air dry. The dried product weighed 57.3 g, 80.1% of theory.

Anal. Calcd. for $C_{36}H_{30}O_3$: C, 82.1; H, 5.7; O, 21.2. Found: C, 81.7; H, 6.1.

The mass spectrum was consistent with the expected fragmentation of 2-ethyl-2-methyl-1,3-propylene di(3-phenanthroate).

Preparation II

2-Ethyl-2-methyl-1,3-propylene Bis(9,10-phenanthroquinone-3-carboxylate)

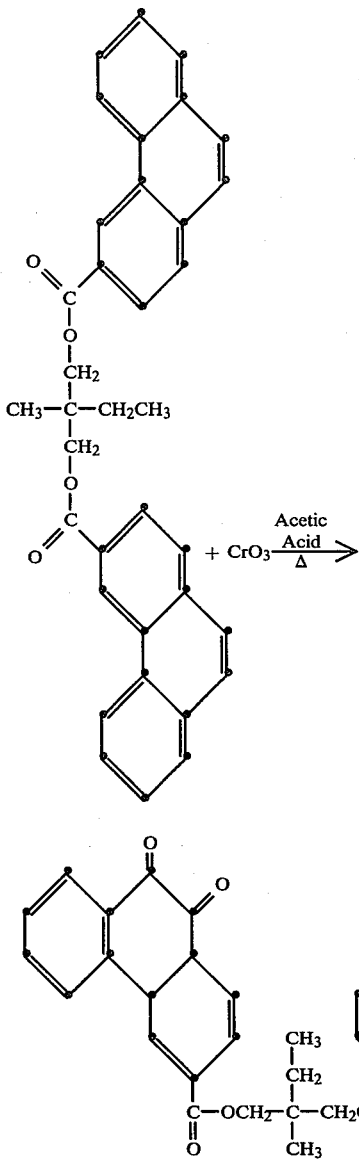

Reactants 30.0 g (0.06 mole) 2-ethyl-2-methyl-1,3-propylene di(3-phenanthroate)
60.0 g (0.60 mole) chromium (VI) trioxide
450 ml glacial acetic acid
1.0 ml distilled water 2-Ethyl-2-methyl-1,3-propylene bis(9,10-phenanthroquinone-3-carboxylate) was prepared, purified and otherwise handled under subdued yellow fluorescent lamps.

Thirty grams of 2-ethyl-2-methyl-1,3-propylene di(3-phenanthroate), 60.0 g chromium (VI) trixoide, 450 ml of glacial acetic acid and 1 ml of water were mixed together at room temperature in a 1-liter, single-necked reaction flask fitted with a magnetic stirrer. The flask was placed in a water bath and the temperature of the bath raised to the boiling point while the reaction mixture was constantly stirred. The dark-colored solution was stirred on a boiling water bath for 0.75 hour, after which time the reaction liquid was poured into 2,000 ml of water. A yellow-orange precipitate separated immediately upon quenching of the reaction mixture. The suspension was filtered and the precipitate thoroughly washed with water to remove any residual chromium salts and subsequently allowed to air dry with suction in the dark. Crude yield of the bis-phenanthroquinone was 26.85 g, 77.9% of theory. The crude precipitate was recrystallized from a minimum amount of acetone as a finely divided crystalline powder, 21.3 g; 61.8% of theory.

Anal. Calcd. for $C_{36}H_{26}O_8$: C, 73.7; H, 4.5; O, 21.8. Found: C, 73.3; H, 4.9.

The mass spectrum was consistent with the expected fragmentation pattern of 2-ethyl-2-methyl-1,3-propylene bis(9,10-phenanthroquinone-3-carboxylate). $_{max}$ was about 410 nm. Infrared analysis showed, e.g., twin absorption peaks at approximately 5.75 and 5.90 micrometers, indicative of the ester moiety(s) attached to the aromatic ring and of the ortho carbonyl moieties on the rings, respectively.

Preparation III

Bis[2-(3-phenanthryl)ethyl] 3-methylglutarate by Azeotropic Distillation of the Water of Reaction

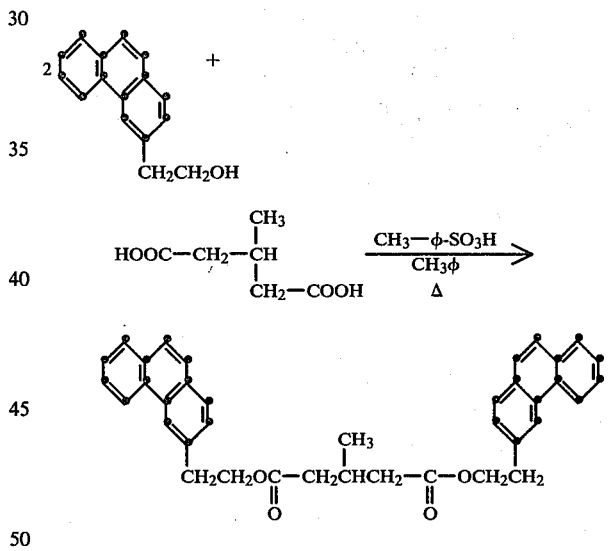

Reactants 22.25 gms (0.10 mole) 2-(3-phenanthryl)ethanol
7.30 gms (0.05 mole) 3-methylglutaric acid (99%)
0.10 gm ($5.8 \times 10^{-4}$ mole) p-toluenesulfonic acid
300.0 mL ACS reagent toluene A one-liter single-necked reaction flask was charged with 2-(3-phenanthryl)ethanol, 3-methylglutaric acid, p-toluenesulfonic acid and reagent grade toluene. The flask was fitted with a Dean-Stark trap, a condenser and a magnetic stirrer. The stirred mixture was held under reflux overnight while water of reaction was removed azeotropically and trapped with the Dean-Stark tube. The mixture was cooled to room temperature and extracted two times with 500 mL portions of 10% sodium bicarbonate. The wet toluene layer was dried overnight with magnesium sulfate whereupon it was filtered and the excess toluene removed in vacuo with a rotary evaporator. The product was recrystallized from acetone chilled to −70° C. Yield is 20.5 gms (75.3% of theory).

Preparation IV

2-Ethyl-2-methyl-1,3-propylene bis[2(3)-phenanthroate]

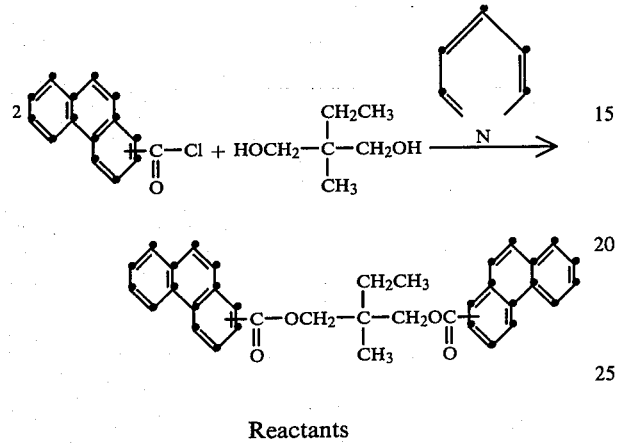

Reactants 75 gms (0.3125 mole) mixed 2- and 3-phenanthroyl chloride 17.7 gms (0.150 mole) 2-ethyl-2-methyl-1,3-propanediol 300 mL pyridine (anhydrous)

Mixed isomeric 2- and/or 3-phenanthroyl chloride was dissolved in anhydrous pyridine. The isomeric solution was charged into a 1-liter three-necked reaction flask fitted with a magnetic stirrer, a reflux condenser and an addition funnel. The pyridine/acid chloride mixture was held under gentle reflux with stirring while 2-ethyl-2-methyl-1,3-propanediol dissolved in anhydrous pyridine was added dropwise to the mixture. The reaction solution was held under reflux for one hour with stirring after complete addition of the acid chloride/pyridine mixture. The solution was allowed to cool to room temperature overnight and filtered to remove precipitated pyridine hydrochloride. The resulting filtrate was added dropwise to 5 liters of water containing 500 mL concentrated hydrochloric acid with vigorous stirring. The resulting white colored powder was collected on a filter and washed with water. The powder was subsequently taken into ethyl ether. The solution was extracted with two 500 mL portions of 10% sodium bicarbonate solution. The ether solution was dried over magnesium sulfate and the excess ether removed in a rotary evaporator in vacuo. The resulting solid was taken up in a minimum of acetone and reprecipitated into water with vigorous stirring to give a white-appearing powder. Yield by this method was 53.1 gms (67.2% of theory).

Other di-phenanthryl esters which have been prepared by azeotropic distillation of the water of reaction include: Bis[2-(3-phenanthryl)ethyl] succinate, 2-(3-phenanthryl)ethyl 3-phenanthroate, and bis[2-(3-phenanthryl)ethyl] 2-ethyl-2-methylsuccinate.

Preparation V

General Synthesis of bis-9,10-phenanthroquinone alkyl esters from bis-phenanthrene precursors

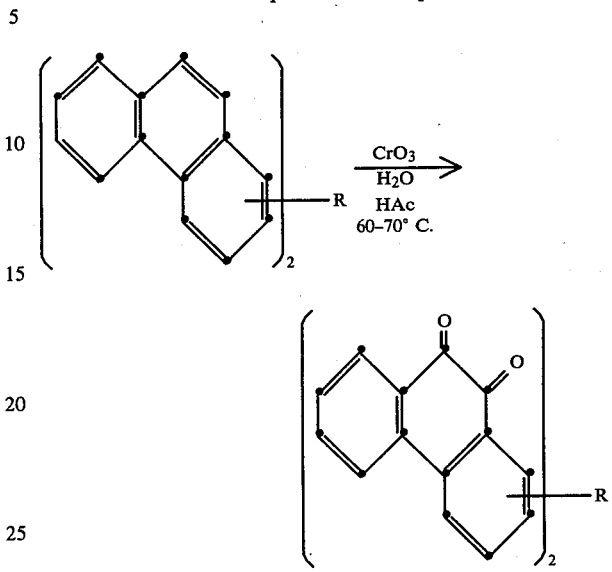

The following is a general preparation of bis, as well as mono, 9,10-phenanthroquinones. The synthesis has been found to have wide applicability in that the phenanthrene moiety can serve as source of either carboxylic acid, i.e.—phenanthroic acid, phenanthrene acetic acid, etc., or alcohol, i.e.,—phenanthrylmethanol, phenanthrylethanol, etc. Oxidation of the side chain or over oxidation of the phenanthrene nucleus has not been observed to be a problem using this technique.

The bis-phenanthrene precursor is first dissolved in a minimum of five parts by weight of glacial acetic acid and the solution charged into a suitably sized three-necked reaction flask fitted with a mechanical stirrer, an addition funnel (pressure equalized) and a thermometer. The flask is placed in a constant temperature bath thermostated at 60° C. and the temperature of the solution is allowed to equilibrate with constant stirring. A solution of chromic anhydride based upon the amount of original phenanthrene used is prepared in the following ratios: chromic anhydride:water:glacial acetic acid: 2.5:2.9:4.0. The chromic anhydride mixture (which can be warmed to effect complete solution of the solid anhydride) is added dropwise to the stirred phenanthrene acetic acid mixture at such a rate that the temperature of the reaction solution does not exceed 70° C. About one hour is sufficient for most additions; however, the addition time varies depending upon the amount of phenanthrene originally taken. If the quinone precipitates from solution upon cooling to room temperature, it is filtered, washed with water, and dried. If, however, upon cooling, no precipitate is observed, the mixture is quenched in a large amount of slowly stirred water. The crude product is filtered and the orange to yellow product washed with large amounts of hot water. The product is recrystallized from acetic acid, dimethylformamide, acetone, or other suitable solvent. Solvents with hydrogen alpha to oxygen atoms should not be used. It is further recommended that all reactions, manipulations, and recrystallizations, be conducted under subdued yellow light.

Preparation VI

Non-symmetric Phenanthroquinones

For those in which the linking group X is

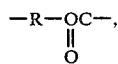

the acid chloride and the hydroxy compound

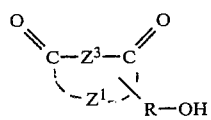

are reacted in pyridine, e.g., as described in Preparation I above.

For those in which the linking group X is acyl, a phenanthrene aldehyde and a ketone, e.g., 3-acetylphenanthrene, are reacted in a base to form the linking group

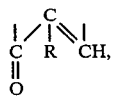

where R is determined by the ketone. The double bond is hydrogenated, e.g., by reacting it with $H_2$ in the presence of ethylene glycol and conventional catalysts, followed by the quinone oxidation step of Preparation V.

For those in which the linking group X is

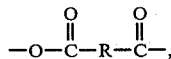

the anhydride of the linking group is reacted with, e.g., phenanthrene, using catalysts such as aluminum trichloride, and the resulting acid is converted to the acid chloride. This is then reacted with a sodium salt of an alcohol of phenanthrene. The oxidation to the quinone proceeds as for the other preparations.

The following compounds are representative of those that have been prepared by the above procedures:
Bis[2-(9,10-phenanthroquinon-3-yl] succinate,
Bis[2-(9,10-phenanthroquinon-3-yl)ethyl] 3-methylglutarate,
Bis[2-(9,10-phenanthroquinon-3-yl)ethyl] 2-ethyl-2-methylsuccinate,
2-(9,10-Phenanthroquinon-3-yl)ethyl 9,10-phenanthroquinone-3-carboxylate,
2-Ethyl-2-methyl-1,3-propylene bis[9,10-phenanthroquinone-2-(3)-carboxylate].

All of these had $\lambda_{max}$ of about 410 nm, and infrared analysis showed, e.g., twin absorption peaks at approximately 5.75 and 5.90 micrometers, indicative of the ester moiety(s) attached to the aromatic ring and of the ortho carbonyl moieties on the rings, respectively. 2-(9,10-phenanthroquinon-3-yl)ethyl 9,10-phenanthroquinone-3-carboxylate has the following carbon, hydrogen analysis:

Anal. Calcd.: C, 76.5; H, 3.7. Found: C, 76.7; H, 3.5.

Other Preparations

The ortho- and paraquinones of structures (II)–(V) above can be prepared by reactions similar to those described for the phenanthroquinones.

EXAMPLES

The following examples further illustrate the nature of the invention.

EXAMPLES 1–10

Coating Procedures

Coatings were made by either whirl-coating or by a hand-coating block using dichloroethane, cyclohexanone or pyridine as a solvent. The polymer, Table II, was 2–5 wt % in solution and the sensitizer-to-polymer ratio was varied from 0.05–0.25. Tests were run using aluminum, poly(ethylene terephthalate) or glass as the substrate. The plates were exposed through a test object using either a Colite Exposer II or a high-pressure Xenon lamp. Mixtures of dichloroethane and cyclohexanone were used as developers as well as 1,1,1-trichloroethane and 1,1,2-trichloroethylene. Development was accomplished in a tray, by swabbing, or in a vapor degreaser.

Results

A synopsis of the testing date is shown in Table III. The highest speeds were obtaned using poly(vinyl 4-methoxybenzoate) or poly(vinyl 4-methylbenzoate) as the polymer. As noted in the Table, these polymers give higher speeds than poly[1,4-cyclohexylenebis(oxyethylene) 1,4-phenylenediacrylate] sensitized with 2-benzoylmethylene-1-methylnaphtho-[1,2-d]thiazoline.

When the coating solutions are heated at reflux the speed or imagery of the finished plates is not altered. The plates themselves were heated at 90° C. for 24 hr with no change in speed or imagery.

TABLE III

| | Colite Exposure Through a Neutral Density Step Wedge | | | |
|---|---|---|---|---|
| Example | Polymer | Sensitizer | Exposure (sec) | Density of Last Solid Step Reproduced | Relative Speed |
| 1 | poly(vinyl 4-methyl-benzoate) | trimethylene bis(9,10-phenanthroquinon-3-carboxylate) | 30 | 1.36 | 1.0 |
| 2 | poly(vinyl 4-methyl-benzoate) | 2-ethyl-2-methyl-1,3-propylene bis-(9,10,phenanthroquinon-3-carboxylate) | 30 | 1.36 | 1.0 |
| 3 | poly(vinyl 4- | 2-ethyl-2- | 30 | 1.36 | 1.0 |

TABLE III-continued

Colite Exposure Through a Neutral Density Step Wedge

| Example | Polymer | Sensitizer | Exposure (sec) | Density of Last Solid Step Reproduced | Relative Speed |
|---|---|---|---|---|---|
| | methoxybenzoate) | methyl-1,3-propylene bis-(9,10,phenanthro-quinon-3-carboxylate) | | | |
| 4 | poly(vinyl 4-iso-propoxycarbonyl) benzoate) | 2-ethyl-2-methyl-1,3-propylene bis-(9,10,phenanthro-quinon-3-carboxylate) | 60 | 1.24 | 0.38 |
| 5 | poly(4-vinyltoluene) | trimethylene bis(9,10-phen-anthroquinon-3-carboxylate) | 30 | 0.86 | 0.32 |
| 6 | poly(4-methoxybenzyl methacrylate) | trimethylene bis(9,10-phen-anthroquinon-3-carboxylate) | 30 | 0.86 | 0.32 |
| 7 | poly[4,4'-isopropyl-idenebis(3,5-dimethyl-phenylene) tere-phthalate) | trimethylene bis(9,10-phen-anthroquinon-3-carboxylate) | 30 | 0.60 | 0.17 |
| 8 | poly[4-(2-formyl-phenoxymethyl)styrene] | 2-ethyl-2-methyl-1,3-propylene bis-(9,10-phenanthro-quinon-3-carboxylate) | 60 | 0.77 | 0.13 |
| 9 | poly(benzyl metha-crylate) | trimethylene bis(9,10-phen-anthroquinone-3-carboxylate) | 60 | 0.45 | 0.06 |
| 10 | poly(vinyl benzoate) | 2-ethyl-2-methyl-1,3-propyl-ene bis(9,10-phen-anthroquin-3-carboxylate) | 300 | 1.14 | 0.06 |
| Control | poly[1,4-cyclohexy-lene bis(oxyethylene) 1,4-phenylenedi-acrylate] | 2-benzoylmethyl-ene-1-methylnaph-tho-[1,2-d]thia-zoline | 30 | 1.24 | 0.76 |

EXAMPLE 11

Photoresist for a Circuit Board

The copper surface of a blank printed circuit board was cleaned and dried. A resist dope was prepared containing 1 g of poly(vinyl 4-methoxybenzoate) and 0.2 g of bis[2-(9,10-phenanthroquinone-3-yl)ethyl] 3-methylglutarate in 10 mL of dichloroethane (12% solids; 20% sens./polymer w/w). The resist was coated on the board with 0.1 mm doctor knife. The board was dried and postbaked for 1 hr at 90° C.

The photoresist was exposed through a mask followed by tray development with 1,1,2-trichloroethylene (2 min). The dry, developed board was then etched at 95° with Baume FeCl₃ solution to etch the unprotected copper. After etching the resist was stripped with dichloromethane to give the finished circuit.

Prebaking for up to 40 hr at 90° C. did not alter the speed or image quality of the circuit. A step exposure of 180 sec with a Colight Xposer II gave a solid step 8 on a Kodak 14-step density scale. Postbaking did not alter the image resistance to etching or image quality.

EXAMPLE 12

Photoresist for a Microelectronic Device

A coating dope of 1 g of poly(vinyl 4-methoxybenzoate) and 0.2 g of bis[2-(9,10-phenanthroquinone-3-yl)ethyl] 3-methylglutarate in 10 mL of dichloroethane was whirl coated onto a $SiO_2$ surface of a silicone wafer to give a thick resist coating. The wafer was exposed at a standard exposing station and developed with 1,1,2-trichloroethylene. An excellent image was obtained with resolution to 3μ lines and spaces.

A subsequent series of exposure showed that a 4% dope of polymer in dichloroethane with 0.012% bis[2-(9,10-phenanthroquinone 3-methylglutarate)] (3% sensitizer to polymer by weight) gave a higher photospeed for imaging and resolved to the 2μ limit of the mask.

The resulting imaged wafers were processed by etching the exposed $SiO_2$. The resist was excellent in withstanding plasma etching (25 min, 75° C., $C_2F_6$) and performed well against $NH_4F$ buffered HF.

EXAMPLE 13

Non-imagewise Curing

A copolymer of acrylic acid and butyl acrylate (70:30) was coated from 1:1 acetone:cyclohexanone at 45% concentration containing 15 mg of bis[2-(9,10-phenanthroquinone-3-yl)ethy] 3-methylglutarate per 10 mL of coating dope. The mixture was spin coated onto aluminum or knife coated with a 0.2 mm doctor knife onto poly(ethylene terephthalate). The dried coatings were exposed 300 sec on a Colite Xposer II (medium pressure HG lamp). This resulted in a hardened film which was insoluble in the coating solvent. (If a test object is used to form an image, a negative image can be obtained by tray development with 1:1 acetone:cyclohexanone.)

The invention has been described in detail with particular reference to certain preferred embodiments thereof, but it will be understood that variations and modifications can be effected within the spirit and scope of the invention.

What is claimed is:

1. A light-sensitive compound having a structural formula

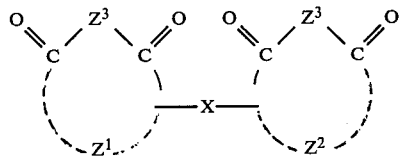

wherein $Z^1$ and $Z^2$ are each independently the number of non-metallic atoms necessary to complete 1, 2, 3, or 4 unsaturated carbocyclic rings of from 6 to 18 nuclear atoms;

$Z^3$ is either a carbon-to-carbon bond or vinylene;

and X is a linking group.

2. A compound as defined in claim 1, wherein $Z^3$ is a carbon-to-carbon bond.

3. A compound as defined in claim 1 or 2, wherein $Z^1$ and $Z^2$ each comprise the atoms necessary to complete a phenanthroquinone nucleus.

4. 2-Ethyl-2-methyl-1,3-propylene bis(9,10-phenanthroquinone-3-carboxylate).

5. Bis[2-(9,10-phenanthroquinone-3-yl)ethyl]succinate.

6. Bis[2-(9,10-phenanthroquinone-3yl)ethyl] 3-methylglutarate.

7. Bis[2-(9,10-phenanthroquinone-3-yl)ethyl] 2-ethyl-2-methylsuccinate.

8. 2-(9,10-Phenanthroquinone-3-yl)-ethyl 9,10-phenanthroquinone-3-carboxylate.

9. 2-Ethyl-2-methyl-1,3-propylene bis[9,10-phenanthroquinone-2(3)-carboxylate].

* * * * *